United States Patent
Kudela et al.

(10) Patent No.: US 8,343,592 B2
(45) Date of Patent: Jan. 1, 2013

(54) ASYMMETRICAL RF DRIVE FOR ELECTRODE OF PLASMA CHAMBER

(75) Inventors: Jozef Kudela, Sunnyvale, CA (US); Carl A. Sorensen, Morgan Hill, CA (US); Soo Young Choi, Fremont, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 804 days.

(21) Appl. No.: 12/343,519

(22) Filed: Dec. 24, 2008

(65) Prior Publication Data

US 2009/0159423 A1 Jun. 25, 2009

Related U.S. Application Data

(60) Provisional application No. 61/016,592, filed on Dec. 25, 2007.

(51) Int. Cl.
*H05H 1/24* (2006.01)
*H01L 21/306* (2006.01)
*C23C 16/00* (2006.01)

(52) U.S. Cl. ............. 427/569; 156/345.43; 156/345.44; 156/345.47; 118/723 E; 118/723 R

(58) Field of Classification Search .................. 427/569; 118/723 R, 723 E, 723 I; 156/345.28, 345.43–345.48; 204/192.12
See application file for complete search history.

(56) References Cited

U.S. PATENT DOCUMENTS

| 5,252,178 A | 10/1993 | Moslehi |
| 5,272,417 A | 12/1993 | Ohmi |
| 5,733,511 A | 3/1998 | De Francesco |
| 5,882,411 A | 3/1999 | Zhao |

(Continued)

FOREIGN PATENT DOCUMENTS

DE 4242894 A1 6/1994

(Continued)

OTHER PUBLICATIONS

"Written opinion of the international searching authority" mailed Jul. 30, 2009 (6 pages) for PCT Application No. PCT/US2008/088265, which has the same specification and drawings as the present application.

(Continued)

*Primary Examiner* — Dah-Wei Yuan
*Assistant Examiner* — Nga Leung V Law
(74) *Attorney, Agent, or Firm* — Robert J. Stern

(57) ABSTRACT

RF power is coupled to one or more RF drive points (50-56) on an electrode (20-28) of a plasma chamber such that the level of RF power coupled to the RF drive points (51-52, 55-56) on the half (61) of the electrode that is closer to the workpiece passageway (12) exceeds the level of RF power coupled to the RF drive points (53-54), if any, on the other half (62) of the electrode. Alternatively, RF power is coupled to one or more RF drive points on an electrode of a plasma chamber such that the weighted mean of the drive point positions is between the center (60) of the electrode and the workpiece passageway. The weighted mean is based on weighting each drive point position by the time-averaged level of RF power coupled to that drive point position. The invention offsets an increase in plasma density that otherwise would exist adjacent the end of the electrode closest to the passageway.

13 Claims, 8 Drawing Sheets

U.S. PATENT DOCUMENTS

| | | | |
|---|---|---|---|
| 6,079,356 | A | 6/2000 | Umotoy |
| 6,228,229 | B1 | 5/2001 | Raaijmakers |
| 6,254,738 | B1 | 7/2001 | Stimson |
| 6,353,201 | B1 | 3/2002 | Yamakoshi |
| 6,359,250 | B1 | 3/2002 | Blonigan |
| 6,456,010 | B2 | 9/2002 | Yamakoshi |
| 6,477,980 | B1 | 11/2002 | White |
| 6,552,297 | B2 | 4/2003 | Blonigan |
| 6,620,290 | B2 | 9/2003 | Yamamoto |
| 6,824,658 | B2 | 11/2004 | Gopalraja |
| 6,827,815 | B2 | 12/2004 | Hytros |
| 6,857,387 | B1 | 2/2005 | Sun |
| 6,863,020 | B2 | 3/2005 | Mitrovic |
| 6,884,635 | B2 | 4/2005 | Parsons |
| 6,916,401 | B2 | 7/2005 | Long |
| 7,141,516 | B2 | 11/2006 | Kawamura |
| 7,153,387 | B1 | 12/2006 | Tomoyasu |
| 7,164,236 | B2 | 1/2007 | Mitrovic |
| 7,205,034 | B2 | 4/2007 | Kawamura |
| 7,270,713 | B2 | 9/2007 | Blonigan |
| 2001/0021422 | A1 | 9/2001 | Yamakoshi |
| 2002/0023899 | A1 | 2/2002 | Khater |
| 2003/0037881 | A1 | 2/2003 | Barnes |
| 2003/0079983 | A1* | 5/2003 | Long et al. .............. 204/164 |
| 2004/0194709 | A1 | 10/2004 | Yamagishi |
| 2005/0183827 | A1 | 8/2005 | White |
| 2006/0049138 | A1 | 3/2006 | Miyake |
| 2006/0105114 | A1 | 5/2006 | White |
| 2008/0274297 | A1 | 11/2008 | Furuta |
| 2009/0159423 | A1 | 6/2009 | Kudela |
| 2009/0202741 | A1 | 8/2009 | Stimson |
| 2011/0126405 | A1 | 6/2011 | Baek |

FOREIGN PATENT DOCUMENTS

| | | |
|---|---|---|
| EP | 0961307 A2 | 12/1999 |
| JP | 08-236294 A | 9/1996 |
| JP | 2002-260899 A | 9/2002 |

OTHER PUBLICATIONS

"International Search Report" mailed Jul. 30, 2009 (2 pages) for PCT Application No. PCT/US2008/088265, which has the same specification and drawings as the present application.

M.A. Lieberman et al., "Standing wave and skin effects in large-area, high-frequency capacitive discharges", Plasma Sources Sci. Technol., vol. 11, pp. 283-293, 2002, UK.

Extended European Search Report dated Dec. 22, 2010 (9 pages) in EP patent application 08863883.8, which has the same specification and drawings as the present application.

* cited by examiner

ASYMMETRICAL RF DRIVE FOR ELECTRODE OF PLASMA CHAMBER

CROSS REFERENCE TO RELATED APPLICATION

This patent application claims the benefit of U.S. Provisional Application No. 61/016,592 filed Dec. 25, 2007.

FIELD OF THE INVENTION

The invention relates generally to coupling an RF power source to an electrode of a plasma chamber used for fabricating electronic devices such as semiconductors, displays and solar cells. The invention relates more specifically to improving the uniformity of a plasma process performed in the chamber by coupling such RF power source to the electrode asymmetrically so as to offset asymmetry in the chamber geometry.

BACKGROUND OF THE INVENTION

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece or etching of selected portions of such layers on the workpiece surface.

It is important for a plasma fabrication process to be performed with high spatial uniformity over the surface of the workpiece. That is, a deposition process should be performed so that the deposited material has uniform thickness and quality at all positions on the surface of the workpiece. Likewise, an etch process should etch material at a uniform rate at all such positions.

Many designs for improving spatial uniformity of plasma fabrication processes have been developed. Many conventional designs attempt to improve spatial uniformity of the fabrication process by maximizing spatial uniformity of the density of the plasma. Other conventional designs attempt to correct for differences between the center and the perimeter of the workpiece in concentration of reactive species by creating a plasma density that varies as a function of radial distance from the center of the workpiece.

A shortcoming of conventional designs is that they cannot compensate for non-uniformities in the plasma density that are not radially symmetrical as a result of asymmetries in the geometry of the plasma chamber.

SUMMARY OF THE INVENTION

We discovered that the workpiece passageway in a plasma chamber produces an asymmetry in the plasma density. Specifically, in a plasma chamber in which an RF powered electrode is capacitively coupled to the plasma, the plasma density is greater adjacent the end of the electrode closest to the passageway than it is adjacent the opposite end of the electrode. The asymmetry in plasma density is undesirable because it produces a corresponding asymmetry in the plasma process (e.g., deposition or etch) being performed on the workpiece.

The present invention offsets such asymmetry by supplying RF power asymmetrically to an electrode of the plasma chamber so that the supply of power is offset toward the direction of the workpiece passageway.

In some of the following definitions and descriptions of the invention, we use the term "RF drive point" to mean a position on an electrode at which RF power is electrically connected to the electrode.

In the present invention, RF power is coupled to one or more RF drive points on an electrode of the plasma chamber such that the weighted mean of the drive point positions is between the center of the electrode and the workpiece passageway. The weighted mean is based on weighting each drive point position by the time-averaged level of RF power coupled to that drive point position.

In a first aspect which is the simplest implementation of the invention, RF power is coupled to one or more RF drive points at positions on the electrode that are offset away from the center toward the workpiece passageway. In other words, the RF drive points are between the center of the electrode and the edge of the electrode closest to the workpiece passageway.

In a second aspect of the invention, RF power is coupled to one or more RF drive points on the electrode such that the level of RF power coupled to one or more RF drive points on the half of the electrode (the first half) that is closer to the workpiece passageway exceeds the level of RF power coupled to the RF drive points, if any, on the other half of the electrode (the second half).

The second aspect of the invention includes embodiments in which a power splitter couples a greater level of RF power to the first half than to the second half of the electrode. The power splitter can include attenuators, preferably passive attenuators, that establish the relative levels of RF power coupled to the first and second halves of the electrode. In one embodiment, each passive attenuator is a capacitance, and the total capacitance of the one or more attenuators connected to the first half of the electrode is less than the total capacitance of the attenuators, if any, connected to the second half of the electrode.

In a third aspect of the invention, the electrode has a number of RF drive points on the half of the electrode (the first half) that is closer to the workpiece passageway that is greater than the number of RF drive points, if any, on the other half of the electrode (the second half).

In all aspects of the invention, the level of RF power coupled to each RF drive point can be time-varying, in which case the effective RF power for purposes of the invention is the time-averaged RF power. For example, in embodiments having a power splitter comprising capacitors, the capacitors can be time-varying, in which case the respective effective capacitances connected to the two respective halves of the electrode is the respective time-averaged capacitances.

The invention is counter-intuitive because one might expect that positioning the RF power drive points closer to the workpiece passageway would further increase the plasma density adjacent the passageway and thereby exacerbate the asymmetry in plasma density. However, we have found that the opposite is true, as explained below.

DETAILED DESCRIPTION OF THE PREFERRED EMBODIMENTS

1. Plasma Chamber Overview

Figure 1:
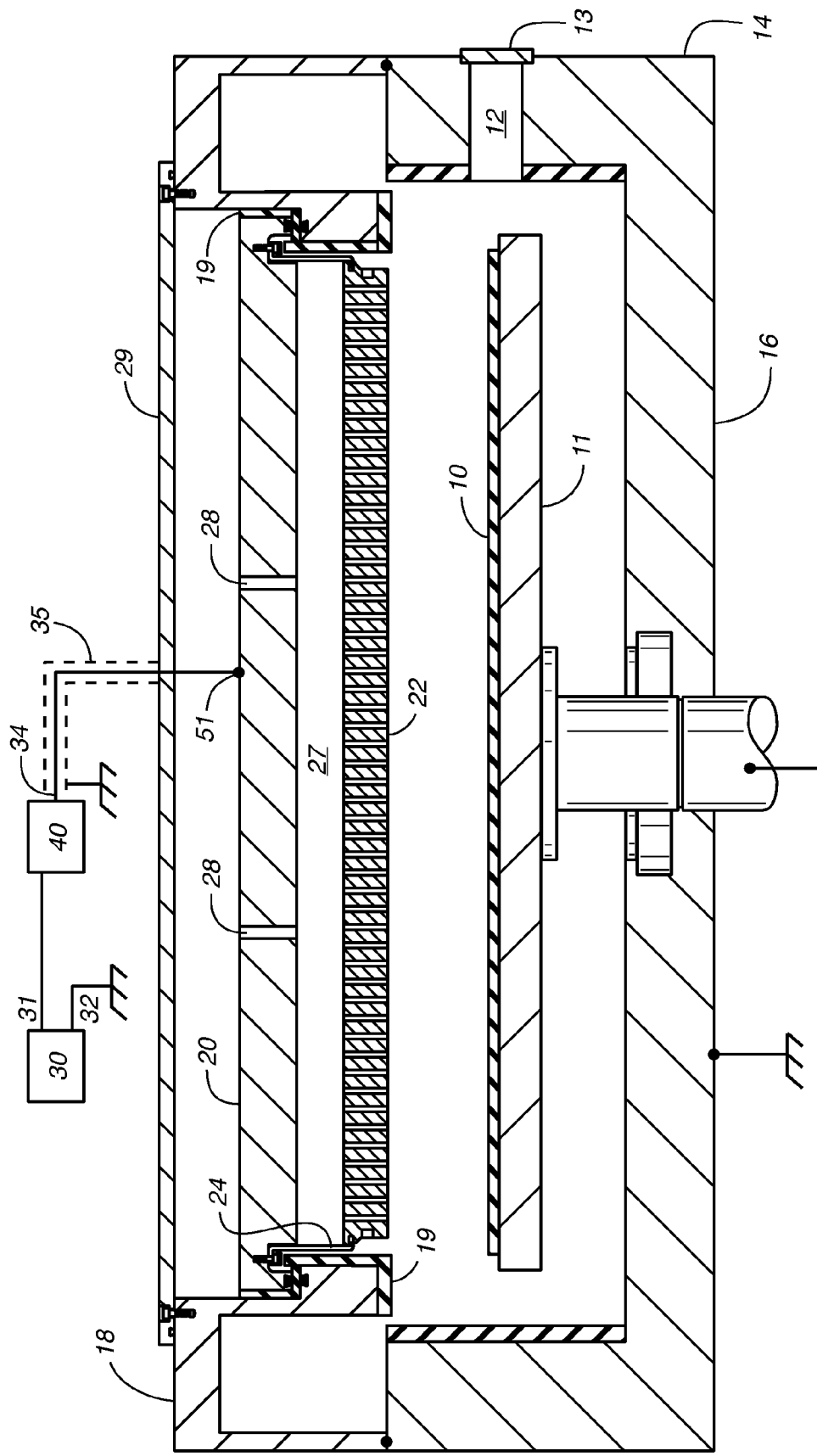
FIG. 1 is a sectional side view of a plasma chamber of a plasma chamber side wall and rectangular electrode having an RF drive point offset from the center of the electrode.

FIG. 1 shows a plasma chamber that includes one embodiment of the invention. Before describing the invention, the conventional components of the plasma chamber will be described.

The plasma chamber is intended to subject a workpiece 10 to a plasma process step for fabricating on the workpiece electronic devices such as semiconductor devices, a display, or solar cells. The workpiece is supported within the chamber by a workpiece support 11, also called a chuck or susceptor. Examples of a workpiece 10 that would be processed within the plasma chamber include a rectangular glass substrate on which flat panel displays are fabricated or a circular semiconductor wafer on which integrated circuits are fabricated.

The plasma chamber has a chamber wall 14-20 that provides a vacuum enclosure for the chamber interior. In the illustrated embodiment, the chamber side wall 14 and chamber bottom wall 16 are implemented as a unitary wall. The top of the chamber wall includes a hinged lid 18 and a gas inlet manifold back wall 20. The chamber side wall 14, chamber bottom wall 16, chamber lid 18, and gas inlet manifold back wall 20 are all considered portions of the chamber wall.

One side of the chamber side wall 14 includes a workpiece passageway 12 through which a workpiece can be carried into the chamber before processing and removed from the chamber after processing of the workpiece. A door 13, typically a slit valve, is opened during ingress or egress of the workpiece and is closed to provide a vacuum seal within the plasma chamber during plasma processing of the workpiece.

In performing a plasma process on the workpiece, one or more process gases are dispensed into the chamber through a gas inlet manifold 20-28. The gas inlet manifold includes the gas inlet manifold back wall 20, a showerhead 22 (also called a gas distribution plate or diffusor), and a suspension 24, all of which collectively enclose a volume, referred to herein as the gas inlet plenum 27, which constitutes the interior region of the gas inlet manifold. For brevity, the gas inlet manifold back wall 20 is referred to simply as the "back wall".

The gas inlet manifold includes one or more gas inlets 28 that provide passageways for gas flow from an external gas source (not shown) to the gas inlet plenum 27. In the FIG. 1 embodiment, the gas inlets 28 are openings extending through the gas inlet manifold back wall 20. The gas source (not shown) supplies process gas to the gas inlets 28, from which the gas flows into the gas inlet plenum 27, then flows from the gas inlet plenum into the interior of the chamber through numerous gas outlet passageways in the showerhead 22. (To simplify the drawings, the gas inlets 28 are omitted from FIGS. 2-8.)

The weight of the showerhead is supported by the suspension 24, which is supported by the gas inlet manifold back wall 20, which is supported by the chamber side wall 14. The suspension 24 preferably is flexible so as to accommodate radial expansion and contraction of the showerhead as the temperature of the showerhead rises and falls. The suspension 24 has an upper end attached to the gas inlet manifold back wall 20 and a lower end attached to the rim at the periphery of the showerhead 22. The latter attachment can be either fixed or sliding. For example, a sliding attachment can be implemented by resting the showerhead rim on the lower end of the suspension.

If the showerhead is rectangular as in the illustrated embodiment, the vertically extending portion of the suspension 24 preferably consists of four flexible aluminum sheets respectively attached to the four sides of the rectangular showerhead 22. Each sheet extends vertically between one side of the rectangular showerhead and a corresponding side of the rectangular back wall 20.

An RF power supply 30 produces an RF voltage between its ungrounded (RF hot) output 31 and its electrically grounded output 32. The ungrounded output 31 of the RF power supply is directly or indirectly connected to at least one ungrounded electrode of the plasma chamber. The grounded output 32 of the RF power supply is connected, through the electrical ground, to at least one other electrode of the chamber that is directly or indirectly connected to electrical ground. The ungrounded and grounded electrodes capacitively couple the RF power produced by the RF power supply to the interior of the chamber, thereby generating or sustaining a plasma within the chamber.

Metal components of the plasma chamber that are directly or indirectly connected to electrical ground and that are capacitively coupled to the plasma within the chamber collectively function as the cathode electrode of the chamber. The electrical ground connection of such components effectively connects them to the grounded output 32 of the RF power supply. The cathode electrode generally includes the chamber side wall 14 because it is electrically grounded. In addition, the cathode electrode generally includes the workpiece support 11 because it is connected directly or indirectly to electrical ground. The indirect connection of the workpiece support to electrical ground may be through a capacitor (not shown) or through a second RF power supply (not shown) whose RF hot output is electrically connected to the workpiece support and whose second output is electrically grounded.

A cover 29 is electrically and mechanically attached to the top of the chamber lid 18, which is electrically and mechanically attached to the electrically grounded chamber side wall 14. Therefore, the cover 29 is electrically grounded and functions as a ground plane relative to the back wall 20 of the RF-powered electrode. As shown in FIG. 1, the electrically grounded outer conductor 35 of coaxial transmission line 34 can be connected to the cover 29. The inner conductor of the transmission line 34 passes through, and is insulated from, the cover 29 and is electrically connected to the back wall 20 of the RF-powered electrode.

Within this patent specification, we use the term "RF-powered electrode" to refer to any electrode of the plasma chamber that is directly or indirected connected to—i.e., that receives RF power from—the ungrounded output of an RF power supply. Because the grounded electrodes are not part of the definition of the invention, for brevity we also use the term "electrode" to mean an RF-powered electrode unless the electrode is specifically described as grounded. Whenever we refer to "the output" of the RF power supply without specifying whether it is the ungrounded or grounded output, the intended meaning is the ungrounded (RF hot) output 31.

The gas inlet manifold 20-28 described above is connected to the ungrounded output 31 of the RF power supply and thereby functions as the RF-powered electrode of the chamber. In other words, the back wall 20, suspension 24 and showerhead 22 collectively perform two functions: a gas distribution function (i.e., dispensing process gas into the plasma chamber) and an electrical function (i.e., coupling RF power to the plasma). When referring to these components 20-28 in the context of their electrical function, we henceforth refer to them as the back wall 20, suspension 24 and showerhead 22 of the RF-powered electrode 20-28 rather than as the back wall, suspension and showerhead of the gas inlet manifold.

The back wall 20, suspension 24 and showerhead 22 are composed of electrically conductive materials, preferably aluminum. The showerhead 22 is the component of the RF-powered electrode 20-28 that directly faces, hence is capacitively coupled directly to, the plasma within the chamber. The components described in the following paragraph provide an electrical connection to couple RF power from the RF power supply 30 to the showerhead, which in turn couples the RF power to the plasma.

One or more RF transmission lines 34 are electrically connected between the RF power supply and the back wall 20 of the RF-powered electrode. The suspension 24 is electrically and mechanically connected to the back wall and the showerhead 22 so as to provide a reliable, low impedance electrical connection between the back wall and the showerhead. Therefore, RF power is coupled from the RF power supply to the back wall 20, through the suspension 24, to the showerhead 22.

An impedance matching network 40 generally is connected between the RF power supply and the RF-powered electrode 20-28. The impedance matching network can include reactances (i.e., capacitors and inductors) at different physical locations. For example, one or more reactances can be mounted physically adjacent to or within the RF power supply, and one or more reactances can be mounted physically adjacent to or directly on the RF-powered electrode of the plasma chamber.

Dielectric liners 19 electrically and mechanically separate the RF powered electrode 20-28 from the electrically grounded chamber lid 18.

Although the electrode 20-28 is inside the plasma chamber in the illustrated embodiment, the electrode can be outside the chamber wall 14-18 if it is adjacent a portion of the chamber wall that is dielectric, thereby permitting RF power to be capacitively coupled from the electrode to the plasma within the chamber. Because the electrode can be inside or outside the chamber wall, the electrode is described herein as an electrode "of" the chamber rather than an electrode "in" the chamber.

The electrode 20-28 in each of the illustrated embodiments is not divided into segments. However, if the electrode is large relative to the wavelength of the RF power, it may be desirable to divide the electrode into segments. In that case, the electrode described in this patent specification encompasses all segments collectively as a single electrode.

Although the present invention primarily relates to the capacitively coupling RF power to the plasma, additional RF power may be coupled to the plasma by other means such as an induction coil or a microwave waveguide. Also, plasma generated in a remote plasma source may be flowed into the chamber interior through a gas inlet.

The embodiments of FIGS. 2-8 described below each include the plasma chamber components described above and shown in FIG. 1. The embodiments of FIGS. 2-8 differ from each other in the positions of their RF drive points 50-56 and in other components that have not yet been described, such as the power splitter 70 or attenuators 41-44.

Because each of FIGS. 2-8 is a top view of the back wall 20 of the electrode, the showerhead 22 and suspension 24 below the back wall are not visible in FIGS. 2-8. Also, as stated above, the gas inlets 28 are omitted from FIGS. 2-8 to simplify the drawings.

2. Basic Principles of the Invention

As stated in the Summary of the Invention, we discovered that the workpiece passageway 12 produces an asymmetry in the plasma density. Specifically, if the electrode 20-28 is connected to the RF power supply either at the center of the electrode or at RF drive points 50-56 that are distributed symmetrically relative to the center of the electrode, the plasma density will be greater adjacent the end of the electrode closest to the workpiece passageway 12 than it is adjacent the opposite end of the electrode.

The present invention offsets the asymmetry caused by the workpiece passageway 12 by supplying RF power to an electrode of the plasma chamber asymmetrically so that the supply of power is offset toward the direction of the workpiece passageway.

The invention is counter-intuitive because one might expect that positioning the supply of RF power closer to the workpiece passageway 12 would further increase the plasma density adjacent the passageway and thereby exacerbate the asymmetry in plasma density. However, we have found that the opposite is true.

While the invention is not limited to any theory of operation, we believe the theoretical basis of the invention is that impedance discontinuities exist at the RF drive points 50-56, at the perimeter of the electrode 20-28, at the perimeter of the susceptor 11, and at the boundary of the plasma. These discontinuities produce a standing wave pattern along the electrode in which the electrical field strength varies with position along the electrode.

Figure 2:
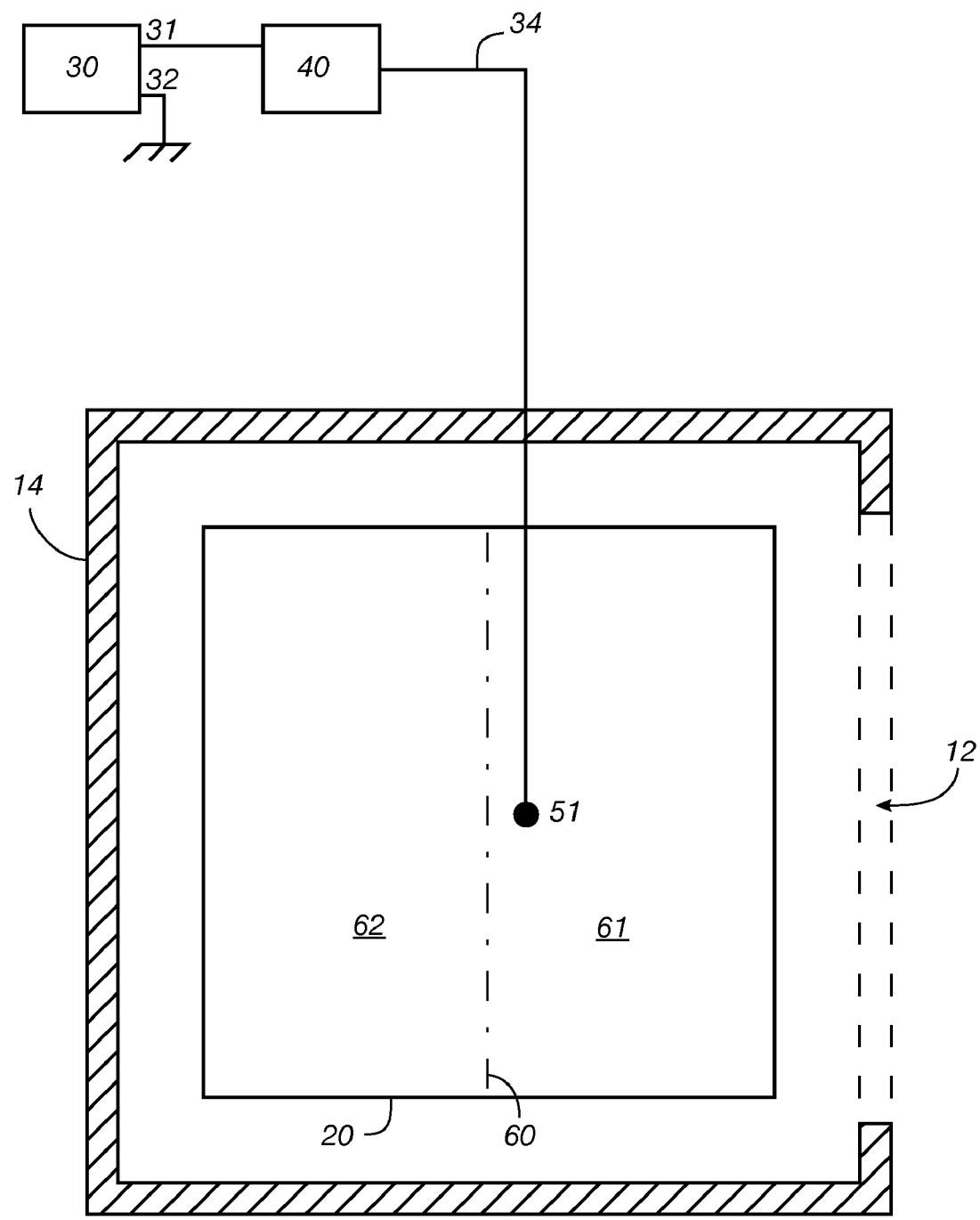
FIG. 2 is a partially schematic sectional top view of the plasma chamber of FIG. 1.

If there is only one RF drive point 51, as in FIGS. 1 and 2, the standing wave pattern along the electrode 20-28 produces an electrical field strength that is smaller in the vicinity of the RF drive point 51 than at distant ends of the electrode. Therefore, the otherwise excessive plasma density toward the workpiece passageway 12 can be ameliorated by positioning the RF drive point between the center of the electrode and the workpiece passageway. In other words, such positioning of the RF drive point decreases the plasma density near the workpiece passageway so as to offset the increase in plasma density near the workpiece passageway that otherwise would exist if the RF power distribution were symmetrical as in conventional plasma chambers.

Preferably, the position of the RF drive point—i.e., the distance by which the RF drive point is offset from the center of the electrode toward the workpiece passageway—is adjusted so as to minimize either the spatial non-uniformity of the plasma density or the spatial non-uniformity of the plasma process being performed on the workpiece.

If there are multiple RF drive points 50-56, as in FIGS. 3-8, the effect of supplying RF power to multiple RF drive points is similar to supplying power to a single RF drive point located at the weighted mean position of the multiple RF drive points. The weighted mean position is defined by weighting each drive point position by the time-averaged level of RF power coupled to that drive point position. Therefore, the otherwise excessive plasma density toward the workpiece passageway can be ameliorated by establishing the positions of the RF drive points and the relative levels of RF power supplied to the RF drive points such that the weighted mean position of the RF drive points is between the center of the electrode and the workpiece passageway.

Preferably, the weighted mean position of the RF drive points is adjusted so as to minimize either the spatial non-uniformity of the plasma density or the spatial non-uniformity of the plasma process being performed on the workpiece. In other words, the weighted mean position is adjusted so that the resulting decrease in plasma density near the workpiece passageway 12 offsets the increase in plasma density in that region that otherwise would exist if the RF power distribution were symmetrical as in conventional plasma chambers.

The adjustment may be accomplished by adjusting the positions of the RF drive points or the respective relative levels of RF power supplied to the respective RF drive points.

As stated in the Summary of the Invention, we use the term "RF drive point" to mean a position on an electrode at which RF power is connected to the electrode.

As stated above in the section "1. Plasma Chamber Overview", the showerhead 22 is the component of the electrode 20-28 that faces, hence is capacitively coupled to, the plasma within the chamber. It is not obvious that shifting the position of an RF drive point on the back wall 20 of the electrode would significantly affect the spatial distribution of the electrical field on the showerhead 22 so as to affect the spatial distribution of the plasma density. We have discovered that shifting the position of an RF drive point on the back wall 20 actually does change the spatial distribution of the plasma density as if one were shifting in the same direction the position of an RF drive point directly on the showerhead 22.

While the invention is not limited to any theory of operation, we believe that the effect described in the preceding paragraph results from the electrically conductive suspension 24 being electrically connected between the perimeter of the back wall 20 and the perimeter of the showerhead 22. If an RF drive point on the back wall is shifted toward the side of the back wall closest to the workpiece passageway 12, the path through which RF current flows from the RF drive point to the end of the showerhead closest to the workpiece passageway 12 is shorter than the path through which RF current flows from the RF drive point to the opposite end of the showerhead, i.e., the end farthest from the workpiece passageway. Consequently, shifting the position of an RF drive point on the back wall 20 of the electrode is equivalent to shifting in the same direction the position of an RF drive point directly on the showerhead 22.

Therefore, throughout this patent specification, when we refer to the position of one or more RF drive points 50-56 on the electrode 20-28, it should be understood that the RF drive points can be on either the showerhead 22 or the back wall 20 of the electrode.

Likewise, it should be understood that the electrode can be a conventional plasma chamber electrode that has no gas distribution function. In other words, the electrode need not be part of a gas inlet manifold and need not include a showerhead.

FIGS. 2-8 show an imaginary center line 60, passing through the center of the back wall 20, that represents the dividing line or boundary between the first half 61 of the electrode that is closer to the workpiece passageway 12 and the second half 62 of the electrode that is farther from the workpiece passageway. Center line 60 is an imaginary geometric line rather than a physical object because preferably there is no mechanical or electrical division or discontinuity between the first and second halves 61, 62 of the electrode. For brevity, the two halves of the electrode 20-28 that are closer and farther from the workpiece passageway are referred to simply as the first half 61 and the second half 62, respectively.

The electrode 20-28 illustrated in FIG. 1-8 is rectangular because the illustrated plasma chamber is adapted for processing a rectangular workpiece. However, as explained in the preceding section "1. Plasma Chamber Overview", the invention is equally applicable to a plasma chamber having a circular electrode that is adapted for processing a circular workpiece. For example, the geometric center line 60 can be a diameter of a circular electrode having first and second halves 61, 62 on opposite sides of the diameter line.

3. RF Drive Point Offset from Center

The embodiment of FIGS. 1 and 2 illustrates the first, and simplest, aspect of the invention, in which RF power is coupled to one or more RF drive points at positions on the electrode that are offset away from the center toward the workpiece passageway. In other words, the RF drive points are between the center of the electrode and the edge of the electrode closest to the workpiece passageway. The embodiment shown in FIGS. 1 and 2 has only one RF drive point, and hence is the simplest implementation of this first aspect of the invention.

As shown in FIGS. 1 and 2, the RF power supply 30 is connected to supply power to the electrode 20-28 at an RF drive point 51 on the back wall 20 of the electrode. (As described above, the circuit also includes a conventional impedance matching network 40 connected between the output of the RF power supply and the RF drive point.)

The RF drive point 51 is positioned between the center of the back wall 20 and the workpiece passageway 12. As explained above in the section "2. Basic Principles of the Invention", offsetting the RF drive point away from the center toward the workpiece passageway decreases the plasma density near the workpiece passageway. This offsets the increase in plasma density near the workpiece passageway that otherwise would exist if the RF power distribution were symmetrical as in conventional plasma chambers.

The position of the RF drive point—specifically, the distance by which the RF drive point is offset from the center of the electrode toward the workpiece passageway—preferably is established so as to minimize either the spatial non-uniformity of the plasma density or the spatial non-uniformity of the plasma fabrication process being performed on the workpiece.

The offset distance of the RF drive point from the center of the electrode preferably is established so as to minimize the spatial non-uniformity of the plasma density or minimize the spatial non-uniformity of the plasma fabrication process being performed on the workpiece. The optimum offset distance of the RF drive point can be established by routine experimentation in which the spatial non-uniformity of the plasma fabrication process is measured for various values of the offset distance.

To facilitate adjusting the position of the RF drive point, the back wall can have a plurality of threaded holes to which an electrical connector can be bolted. The position of the RF drive point can be adjusted by moving an electrical connector from one threaded hole to another. Alternatively, back wall can include a track along which the electrical connector can slide to adjust the position of the RF drive point.

As stated in the preceding section "2. Basic Principles of the Invention", an alternative embodiment is to connect the RF output of the impedance matching network directly to an RF drive point on the showerhead 22 rather than an RF drive point on the back wall 20. Another alternative embodiment is to connect the RF output of the impedance matching network to an electrode that is not part of a gas inlet manifold and does not include a showerhead.

4. Unequal Power Distribution

FIGS. 3-7 show various alternative embodiments of a second aspect of the invention. According to this second aspect of the invention, as defined above in the "Summary of the Invention", the level of RF power coupled to RF drive points 51-52 on the first half 61 of the electrode (the half that is closer to the workpiece passageway) exceeds the level of RF power coupled to RF drive points 53-54, if any, on the second half 62 of the electrode 20-28.

Figure 3:
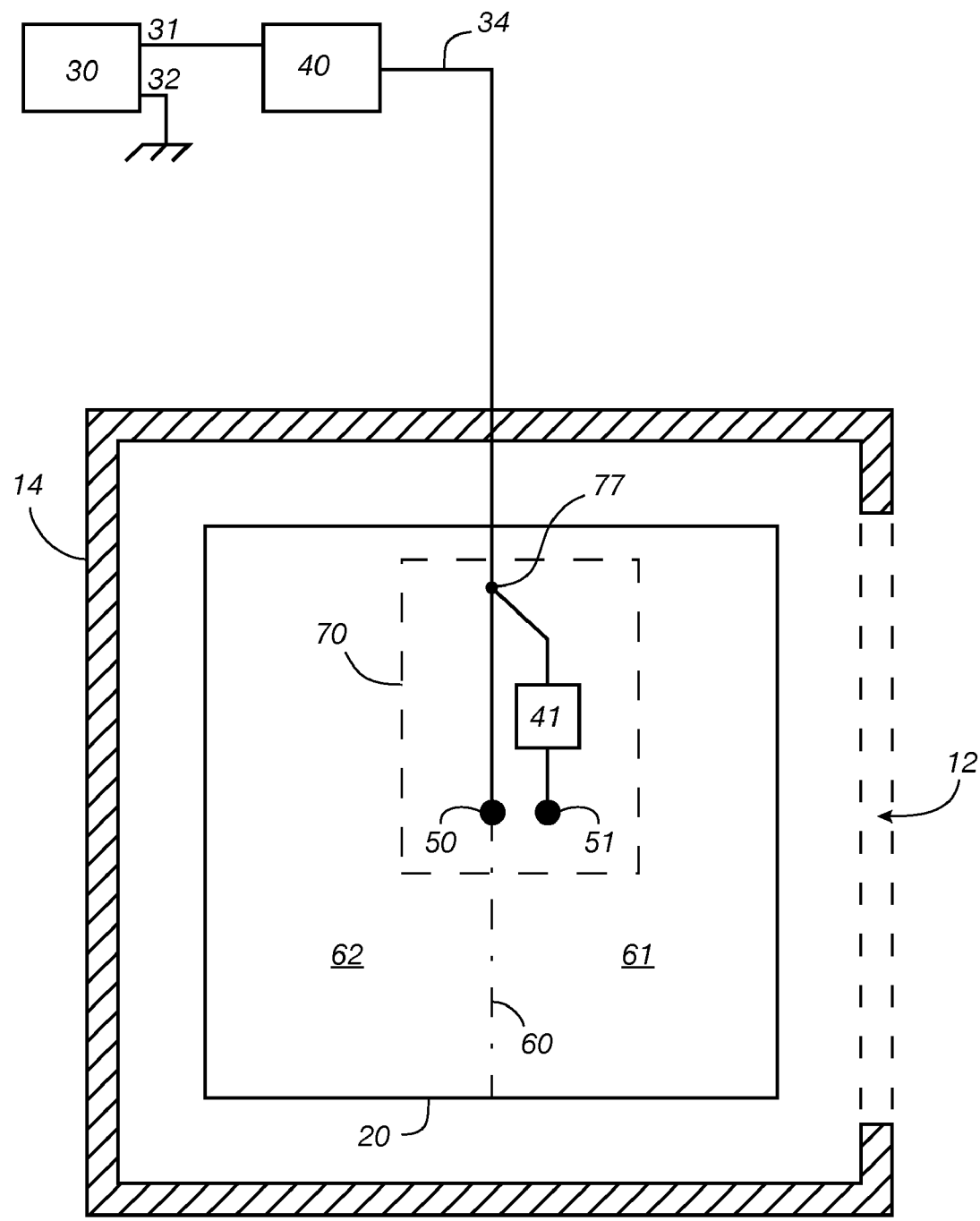
FIG. 3 is similar to FIG. 2 except that it further includes a second RF drive point at the center of the electrode and a reactance in series with the off-center RF drive point.

FIG. 3 shows an embodiment similar to the embodiment of FIG. 2, except that it further includes a second RF drive point 50 at the center of the electrode. An RF drive point at the center of the electrode is not in either the first half 61 or the second half 62 of the electrode for purposes of the invention, so the FIG. 3 embodiment is effectively like the FIG. 2 embodiment having an RF drive point 51 offset away from the center toward the workpiece passageway 12.

Stated differently, the FIG. 3 embodiment includes no RF drive point in the second half 62 of the electrode, hence there is zero RF power coupled to RF drive points on the second half 62 of the electrode. Therefore, the embodiment of FIG. 3 fulfills the definition of the second aspect of the invention as set forth in the second preceding paragraph, because the level of RF power coupled to the RF drive point 51 on the first half 61 of the electrode exceeds the zero RF power coupled to the second half 62 of the electrode.

The FIG. 3 embodiment also includes an attenuator 41 connected to the off-center RF drive point 51. The attenuator preferably is a passive attenuator, i.e., a circuit including only passive components. To minimize power dissipation in the attenuator, the attenuator preferably is a reactance, i.e., an inductor, a capacitor, or a combination of one or more inductors and capacitors. The inductors or capacitors can be fixed or adjustable. An attenuator 41 consisting of only a single adjustable capacitor is preferred because it is simple and flexible.

The reactance value of the attenuator 41 preferably is established or adjusted so as to minimize either the spatial non-uniformity of the plasma density or the spatial non-uniformity of the plasma fabrication process being performed on the workpiece. The optimum reactance value can be determined by routine experimentation in which the spatial non-uniformity of the plasma fabrication process is measured for various values of the reactance of attenuator 41.

As a further alternative, the embodiment of FIG. 3 can be modified by inserting a second reactance (not shown) in series with the center RF drive point 50, that is, between the impedance matching network 40 and the RF drive point 50. If the two reactances are adjustable capacitors, preferably one capacitance should increase while the other capacitance decreases by an equal amount so that the sum of the two capacitances remains constant. This will reduce changes in the load impedance presented to the output of the impedance matching network when the two capacitors are adjusted.

The dashed line 70 in FIG. 3 signifies that the RF power connection through the attenuator 41 to the off-center RF drive point 51, in combination with the connection to the centered RF drive point 50 (either a direct connection as shown or a connection through a second reactance as described in the preceding paragraph), constitutes an implementation of an RF power splitter 70 as will be described more generally in the following discussion of FIG. 4.

Figure 4:
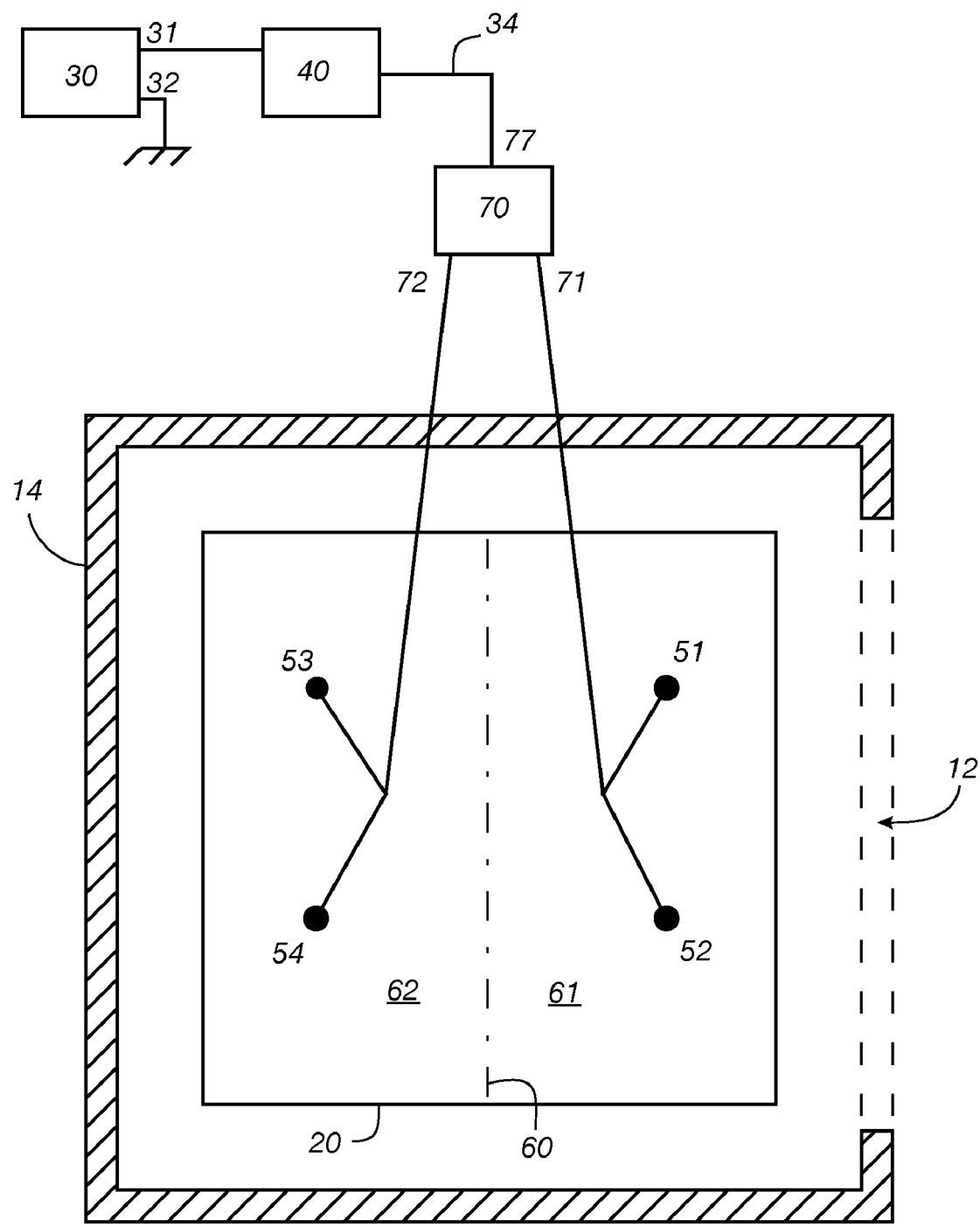
FIG. 4 is similar to FIG. 2 except that the electrode has four RF drive points connected to a power splitter.

In the embodiment of FIG. 4, RF power is coupled to the rectangular electrode 20-28 at four RF drive points 51-54 respectively located in four quadrants of the rectangular back wall 20 of the electrode. Two of the RF drive points 51, 52 are in the first half 61 of the back wall 20 closer to the workpiece passageway 12, hence are in the first half of the electrode that is closer to the workpiece passageway. The other two RF drive points 53, 54 are in the opposite half 62 of the back wall, hence are in the second half of the electrode that is farther from the workpiece passageway.

FIG. 4 shows the output of the RF power supply 30 connected to a conventional impedance matching network 40. The output of the impedance matching network is connected to the input 77 of an RF power splitter 70 that has two outputs 71, 72. The first output 71 of the RF power splitter is connected to the two RF drive points 51, 52 on the first half 61 of the electrode. The second output 72 of the RF power splitter is connected to the two RF drive points 53, 54 on the second half 62 of the electrode.

The RF power splitter 70 is configured or adjusted to provide a higher level of RF power to its first output 71 than to its second output 72. Consequently, the level of RF power coupled to the RF drive points 51, 52 on the half of the electrode that is closer to the workpiece passageway exceeds the level of RF power coupled to RF drive points 53, 54 on the other half of the electrode.

As explained above in the section "2. Basic Principles of the Invention", this unequal distribution of RF power decreases the plasma density adjacent the first half 61 of the electrode and increases the plasma density adjacent the second half 62 of the electrode. This offsets the effect of the workpiece passageway which, if the RF power distribution were symmetrical as in conventional plasma chambers, would produce a plasma density that is greater adjacent the first half 61 than the second half 62.

Preferably the difference between the power levels of the first and second outputs of the RF power splitter is established so as to minimize the spatial non-uniformity of the plasma density or minimize the spatial non-uniformity of the plasma fabrication process being performed on the workpiece. The optimum value for the difference in RF power levels can be established by routine experimentation in which the spatial non-uniformity of the plasma fabrication process is measured for various values of the power difference.

5. Passive Attenuators as Power Splitter

Figure 5:
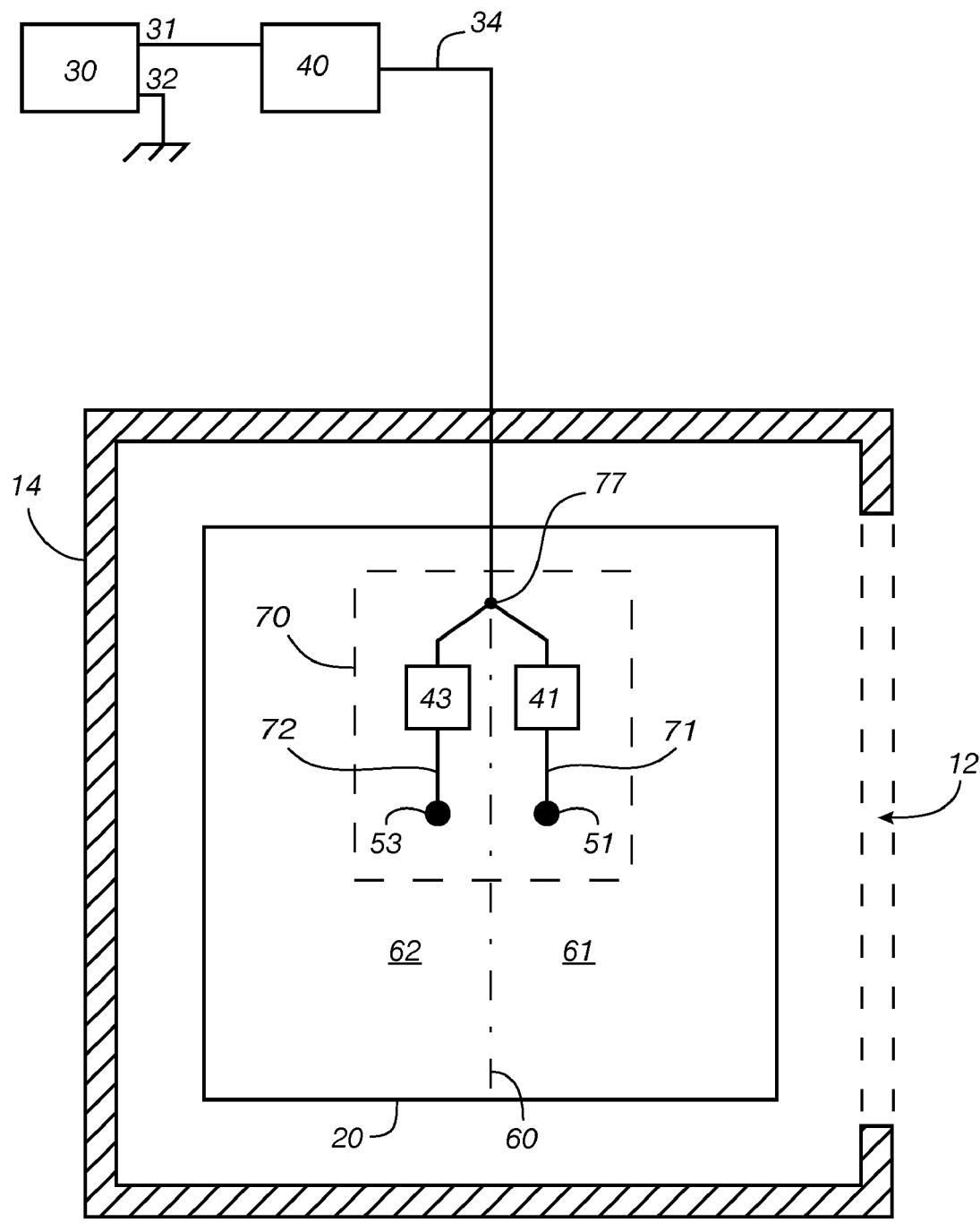
FIG. 5 is similar to FIG. 4 except that it has only two RF drive points, and the power splitter comprises two attenuators.

FIG. 5 shows an alternative embodiment in which the power splitter 70 is implemented as first and second attenuators 41, 43. The inputs of the attenuators 41, 43 are connected together so as to constitute the input 77 of the power splitter. The output of each respective attenuator constitutes a respective output of the power splitter.

The output of the RF power supply 30 is connected to the input of an impedance matching network 40, whose output is connected to the input 77 of the power splitter, i.e., the common input of the attenuators 41, 43. The respective outputs of the first and second attenuators 41, 43 are connected to the first and second RF drive points 51, 53, respectively.

Each attenuator preferably is a passive attenuator, i.e., a circuit including only passive components. To minimize power dissipation in the attenuators, each attenuator preferably is a reactance, i.e., an inductor, a capacitor, or a combination of one or more inductors and capacitors. The inductors or capacitors can be fixed or adjustable.

As in the FIG. 4 embodiment, the power splitter 70 (comprising attenuators 41, 43) supplies a level of RF power to one or more RF drive points on the first half 61 of the electrode (in the FIG. 5 embodiment, a first RF drive point 51) that exceeds the level of RF power coupled to the RF drive points, if any, on the second half 62 of the electrode (in the FIG. 5 embodiment, a second RF drive point 53). As in the FIG. 4 embodiment, the first and second halves 61, 62 represent the halves of the electrode 20-28 that are closer to and farther from the workpiece passageway 12, respectively.

More specifically, the respective electrical impedances of the first and second attenuators 41, 43 are established or adjusted so that the level of RF power coupled from the power splitter input 77, through the first attenuator 41, to the RF drive point 51 on the first half of the electrode is greater than the level of RF power coupled from the power splitter input 77, through the second attenuator 43, to the RF drive point 53 on the second half of the electrode.

The respective level of RF power coupled through each respective RF drive point 51, 53 is inversely proportional to the total impedance of the RF current path from the power splitter input 77, through the respective attenuator 41, 43, through the respective RF drive point 51, 53, and through the plasma to the cathode electrode or electrical ground. Each such respective total impedance is the complex sum of the impedance of the respective attenuator 41, 43 and the complex load impedance between each respective RF drive point 51, 53 and electrical ground. Such load impedance includes the following complex impedances, which are effectively connected in series and therefore are additive: the impedance of the plasma body, the impedance of the plasma sheath, the capacitance between the plasma sheath and the cathode electrode, the capacitance between the plasma sheath and the showerhead 22, and the impedance of the RF current path between the respective RF drive point and the showerhead surface facing the plasma sheath.

We have found that the load impedance between each respective RF drive point 51, 53 and electrical ground is dominated by the last item listed above, the impedance of the RF current path within the electrode from each respective RF drive point to the surface of the showerhead 22 that faces the plasma sheath, i.e., the lower surface of the showerhead. Unless the RF drive points are extremely close to the perimeter of the back wall 20, this impedance is inductive because the RF current path from each individual RF drive point forms a loop in which the current flows through the back wall radially outward from the RF drive point 51, 53 to the perimeter of the back wall, then down the suspension 24 to the perimeter of the showerhead 22, and then through the lower surface of the showerhead in a radially inward direction toward the center of the lower surface.

Preferably the attenuators 41, 43 are capacitors because capacitors that are capable of handling high voltage and high power with low power loss are more compact than inductors, and adjustable capacitors are easier to implement than adjustable inductors. The complex impedance of an inductance is a positive reactance, and the complex impedance of a capacitance is a negative reactance. Therefore, the total impedance of the RF current path (defined in the second preceding paragraph) through each respective drive point 51, 53 is a reactance equal to the magnitude of the inductive load impedance at that RF drive point (described in the preceding paragraph) minus the magnitude of the capacitive reactance of the respective attenuator 41, 43. Preferably each respective attenuator should have a capacitive reactance whose magnitude is smaller than the inductive load impedance at its respective RF drive point, so that the result of the aforesaid subtraction is positive, whereby the aforesaid total impedance is inductive. This is advantageous because the impedance matching network 40 does not require any inductors if its output is connected to an inductive load.

In summary, when the total impedance is inductive as just described, the total impedance of each attenuator 41, 43 in series with the load impedance at its respective RF drive point 51, 53 decreases with an increase in the capacitive reactance of the respective attenuator. Therefore, the RF current supplied to the RF drive point 51 in the first half 61 of the electrode will be greater than the RF current supplied to the RF drive point 53 in the second half 62 if the first attenuator 41 has a greater capacitive reactance (i.e., a smaller capacitance) than the second attenuator 43. This fulfills the requirements of the "second aspect" of the invention defined near the beginning of the preceding section "4. Unequal Power Distribution".

In other words, the capacitance of the first attenuator 41 connected to the first half 61 of the electrode should be smaller than the capacitance of the second attenuator 43 connected to the second half 62.

If the respective attenuators 41, 43 include respective adjustable capacitors, it is preferable to adjust their respective capacitances by equal amounts in opposite directions so that the sum of the two capacitances remains constant. In other words, if one capacitance is increased, the other capacitance should be decreased by an equal amount. The advantage of such equal and opposite adjustment is that the total impedance at the input 77 of the power splitter 70 will remain approximately constant, thereby minimizing the need for the impedance matching network to match different impedances as the capacitors are adjusted.

Figure 6:
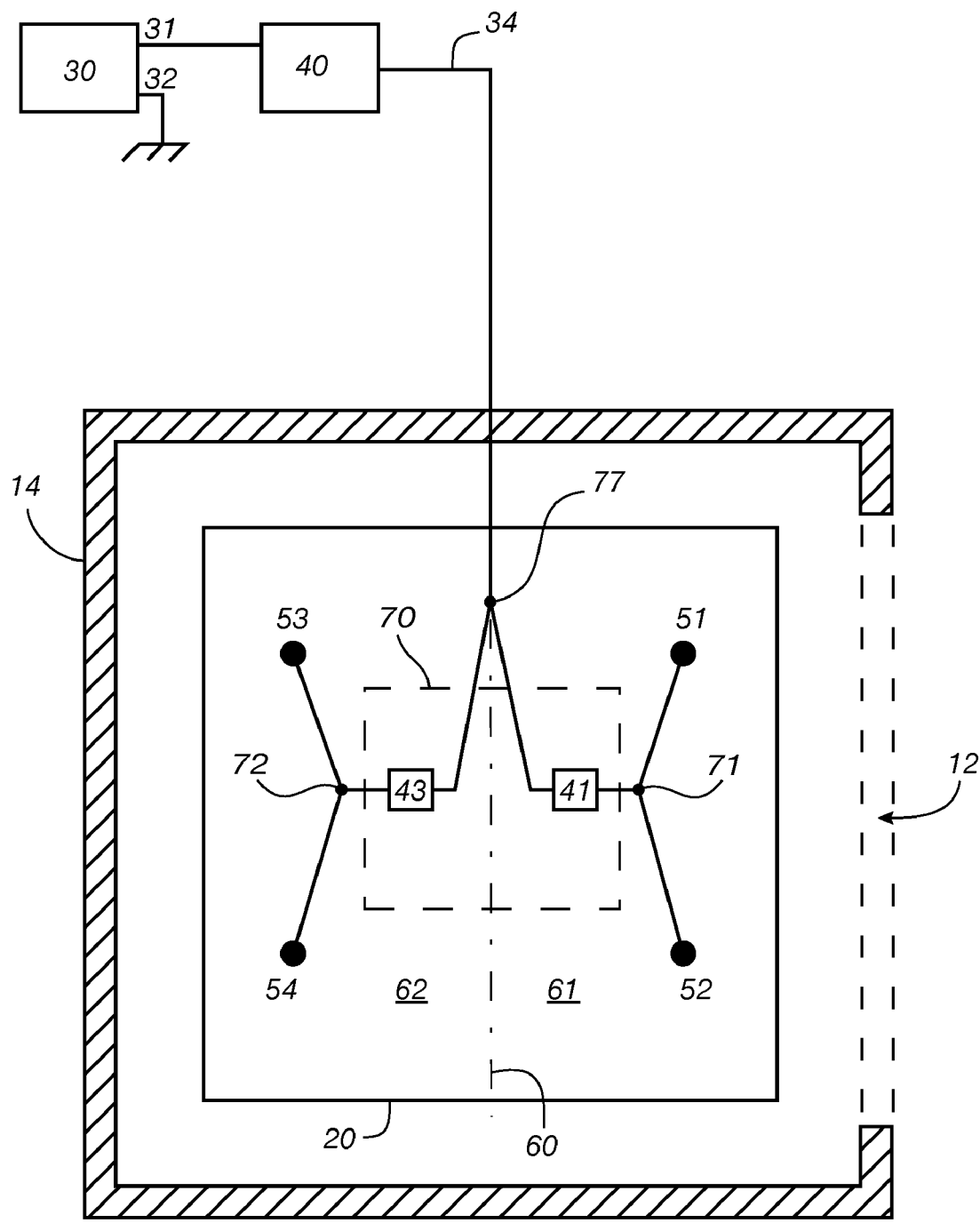
FIG. 6 is similar to FIG. 5 except that it has four RF drive points, with each attenuator being connected to two of the RF drive points.

In the examples of FIGS. 4 and 5, each output of the power splitter, or each attenuator, is connected to one RF drive point. Alternatively, each output of the power splitter, or each attenuator, can be connected to supply RF power to two or more RF drive points. For example, FIG. 6 shows an embodiment similar to that of FIG. 5, except that the back wall 20 of the electrode has four RF drive points, with two RF drive points being connected to each output 71, 72 of the power splitter. The two RF drive points 51, 52 on the first half 61 of the electrode are connected to the first output 71 of the power splitter (i.e., to the output of the first attenuator 41), and the two RF drive points 53, 54 on the second half 62 of the electrode are connected to the second output 72 of the power splitter (i.e., to the output of the second attenuator 43).

In FIG. 6, the design principles for the relative impedances of the two attenuators 41, 43 and the relative levels of RF power supplied by the two power splitter outputs 71, 72 are the same as discussed above with respect to FIG. 5.

Figure 7:
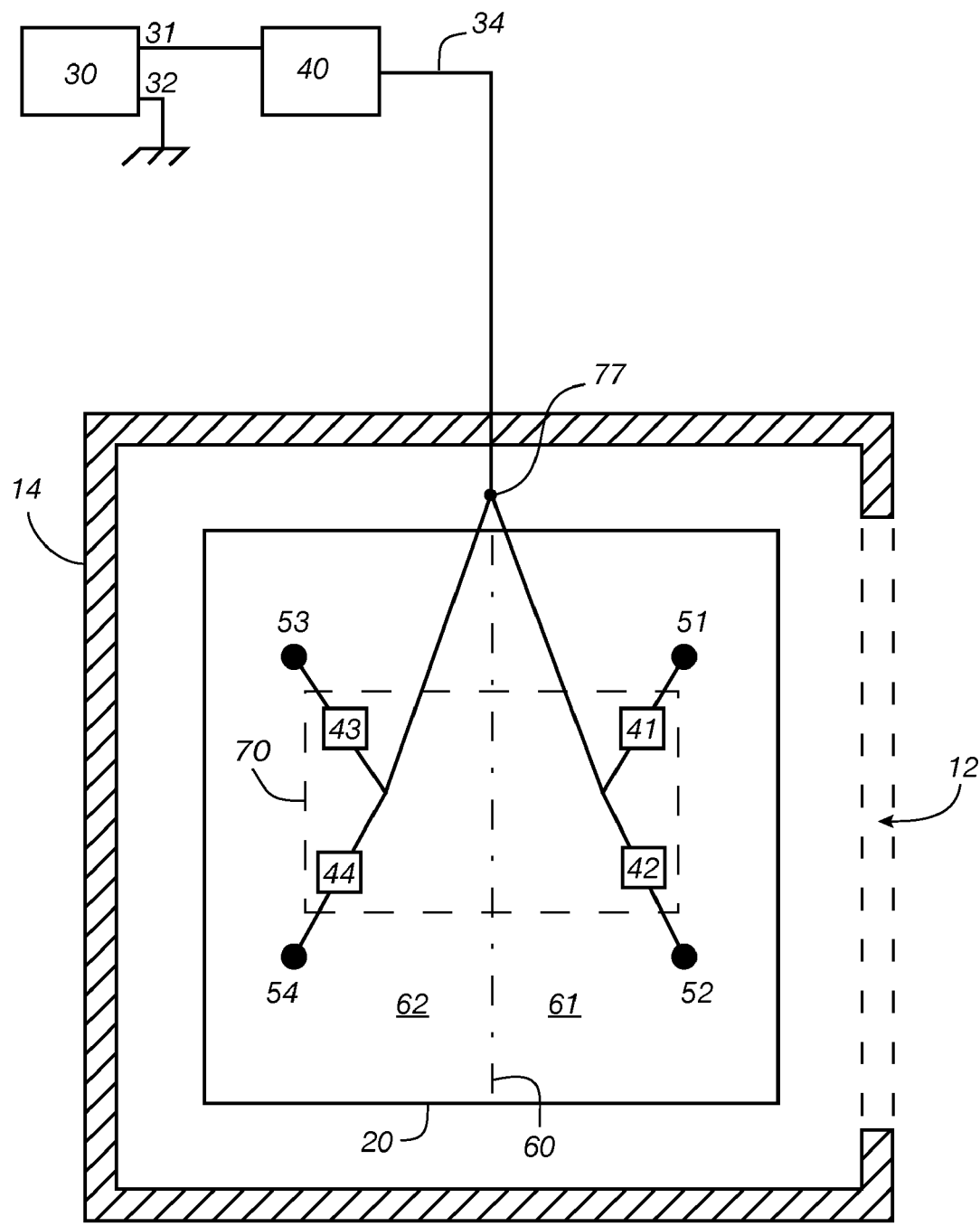
FIG. 7 is similar to FIG. 6 except that it has four attenuators.

FIG. 7 shows an embodiment similar to that of FIG. 6, except that each RF drive point 51-54 is connected to a distinct attenuator 41-44, respectively. Specifically, a first portion of the RF power is coupled through attenuators 41 and 42 to RF drive points 51 and 52, respectively, on the first half 61 of the electrode. The remainder of the RF power is coupled through attenuators 43 and 44 to RF drive points 53 and 54, respectively, on the second half 62 of the electrode.

The respective electrical impedances of the attenuators 41-44 should be established or adjusted so that the total level of RF power coupled through attenuators 41 and 42 to the RF drive points 51 and 52 on the first half of the electrode is greater than the total level of RF power coupled through attenuators 43 and 44 to the RF drive points 53 and 54 on the second half of the electrode.

If the attenuators 41-44 are capacitors, the relative power levels defined in the preceding paragraph are achieved if the total capacitance connected between the power splitter input 77 and the first half 61 of the electrode is less than the total capacitance connected between the power splitter input 77 and the second half 62. As stated in the preceding description of FIG. 5, this presumes that the impedance at the power splitter input is inductive, which is true if each attenuator 41-44 has a capacitance value large enough that the magnitude of its capacitive reactance is less than the magnitude of the inductive load impedance at its respective RF drive point 51-54.

The total capacitance connected between the power splitter input 77 and the first half 61 of the electrode is the sum of the capacitances of the attenuators 41 and 42 connected to the RF drive points 51 and 52 on the first half of the electrode. Likewise, the total capacitance connected between the power splitter input 77 and the second half 62 of the electrode is the sum of the capacitances of the attenuators 43 and 44 connected to the RF drive points 53 and 54 on the second half of the electrode.

Therefore, the sum of the capacitances of the attenuators 41 and 42 coupled to the first half 61 of the electrode should be less than the sum of the capacitances of the attenuators 43 and 44 coupled to the second half 62 of the electrode.

The attenuators just described achieve the advantages of the invention explained in the above section "2. Basic Principles of the Invention". Specifically, supplying greater RF power to the first half 61 of the electrode than to the second half 62 decreases the plasma density adjacent the first half 61 of the electrode and increases the plasma density adjacent the second half 62 of the electrode. This offsets the effect of the workpiece passageway which, if the RF power distribution were symmetrical as in conventional plasma chambers, would produce a plasma density that is greater adjacent the first half 61 than the second half 62.

Preferably the difference between the combined impedance of the attenuators 41, 42 connected to the first half 61 of the electrode and the combined impedance of the attenuators 43, 44 connected to the second half 62 is established so as to minimize either the spatial non-uniformity of the plasma density or the spatial non-uniformity of the plasma fabrication process being performed on the workpiece. The optimum value for this difference in impedance can be established by routine experimentation in which the spatial non-uniformity of the plasma fabrication process is measured for various values of this difference in impedance.

To facilitate adjusting the aforesaid difference in impedance, some or all of the attenuators 41-44 can be adjustable reactances such as conventional adjustable capacitors or adjustable inductors. Alternatively, the attenuators can be fixed reactances whose values are established by experimentation as described in the preceding paragraph.

Some of the RF drive points can be connected directly to the power splitter input 77 with no intervening attenuator. This would be equivalent to connecting those RF drive points to an attenuator of zero impedance for purposes of determining the aforesaid difference in impedance.

Conversely, there need not be any RF power connection to the second half 62 of the electrode, i.e., the half that is farther from the workpiece passageway. This would be equivalent to the FIG. 2 embodiment having an RF drive point offset toward the workpiece passageway.

As described below in the section entitled "8. Time Averaging", the impedance of each of the attenuators 41-44 can be time-varying, thereby causing the level of RF power coupled to each RF drive point to be time-varying. In that case, the effective RF power supplied to each respective half of the electrode is the time-averaged RF power supplied to that half of the electrode. If the attenuators 41-44 are capacitors, the capacitors can be time-varying, in which case the effective capacitance of each capacitor would the time average of its capacitance.

If the impedances of the attenuators 41-44 are either adjustable or time-varying, it is preferable to change two or more of the impedances in opposite directions so that the total impedance of the multiple attenuators remains approximately constant, i.e., so that the total impedance at the input 77 of the power splitter 70 remains approximately constant. This has the advantage of minimizing the need for the impedance matching network 40 to match different impedances as the attenuators are adjusted.

More specifically, if the attenuators 41-44 are adjustable capacitors, it is preferable to change two or more of the capacitances in opposite directions so that the total capacitance of the multiple attenuators remains approximately constant. For example, the capacitance of attenuators 41, 42 connected to the first half 61 of the electrode preferably should be increased at the same time the capacitance of attenuators 43, 44 connected to the second half 62 is decreased, and vice versa.

6. Unequal Numbers of RF Drive Points

Figure 8:
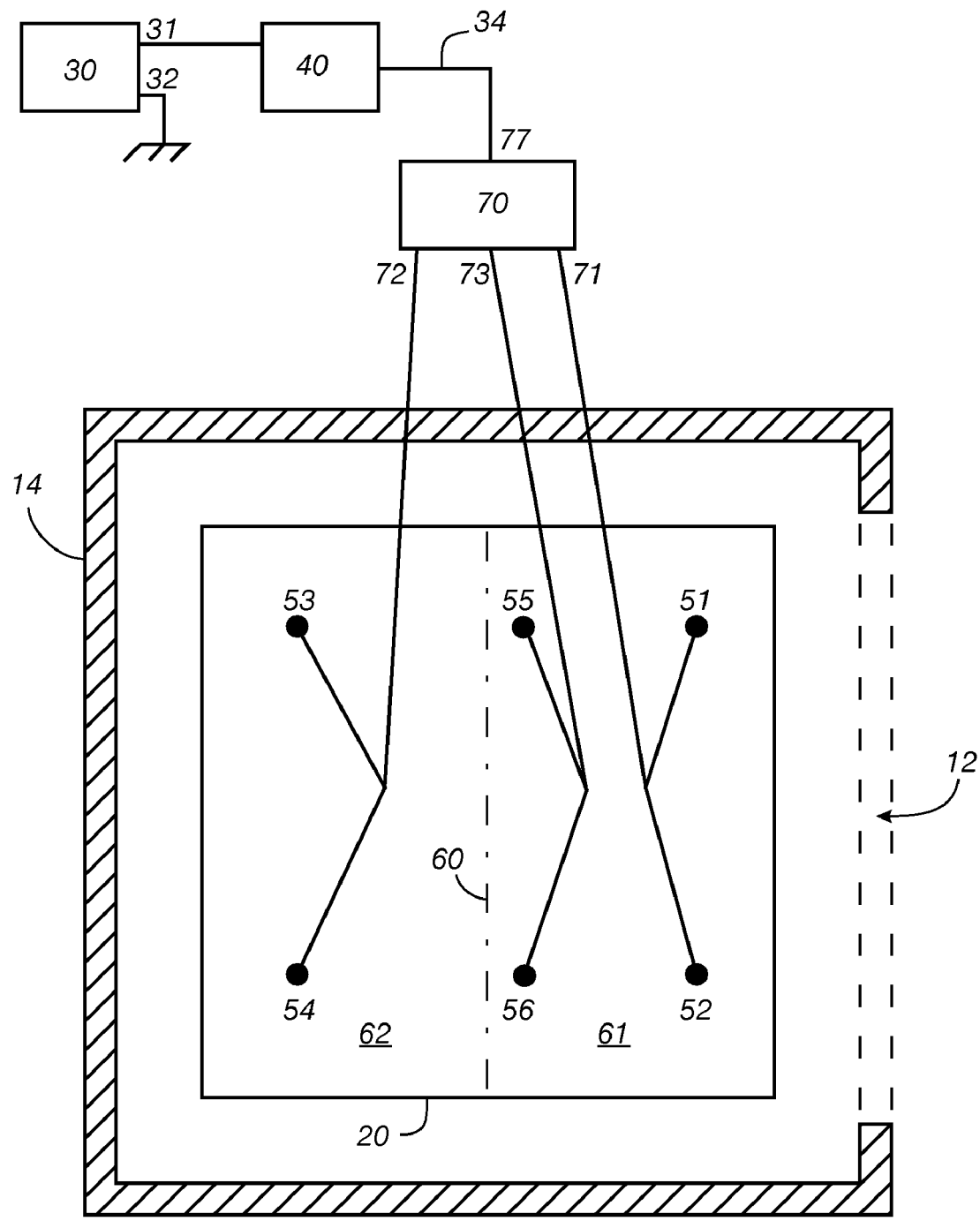
FIG. 8 is similar to FIG. 4 except that it has six RF drive points at various distances from the center of the electrode.

FIG. 8 illustrates an embodiment of the invention in which, as in the embodiments of FIGS. 2 and 3, the number of RF drive points 51, 52, 55, 56 on the first half 61 of the electrode 20-28 is greater than the number of RF drive points 53, 54 on the second half 62 of the electrode.

Specifically, the FIG. 8 embodiment includes four symmetrically positioned RF drive points 51-54 as in the embodiments of FIGS. 4, 6 and 7, plus two additional RF drive points 55, 56 that are in the first half 61 of the back wall 20 but are closer to the imaginary center line 60 of the back wall that represents the boundary between the first and second halves 61, 62.

The output of the RF power supply 30 is connected to the impedance matching network 40, whose output is connected to power splitter 70. The power splitter 70 has three outputs 71-73: the first splitter output 71 is connected to the RF drive points 51, 52 in the first half 61 of the back wall (i.e., the half closer to the workpiece passageway); the second splitter output 72 is connected to the RF drive points 53, 54 on the second half of the back wall; and the third splitter output 73 is connected to the RF drive points 55, 56 that are in the first half 61 but only slightly offset from the imaginary center line 60.

If the power splitter 70 supplies an approximately equal level of RF power to each of the RF drive points 51-56, then the level of RF power supplied to the first half of the electrode will be greater than the level supplied to the second half, thereby satisfying the requirements of the "second aspect" of the invention defined near the beginning of the above section "4. Unequal Power Distribution".

Accordingly, an alternative definition of the invention is that the electrode 20-28 has a number of RF drive points 51, 52, 55, 56 on the first half of the electrode (i.e., the half closer to the workpiece passageway) that is greater than the number of RF drive points 53, 54 on the second half of the electrode.

7. Weighted Mean of RF Drive Point Positions

Alternatively, the power splitter 70 in FIG. 8 can provide unequal levels of RF power at its outputs 71-72, in which case FIG. 8 illustrates a more complex embodiment of the invention.

The RF drive points 51-56 in combination produce a spatial distribution of plasma density similar to what would be produced by a single RF drive point whose position on the electrode is the weighted mean of the positions of the actual RF drive points 51-56. Therefore, the weighted mean of the positions of the actual RF drive points can be considered to be the position of a "virtual" RF drive point. The weighted mean is based on weighting each drive point position by the time-averaged level of RF power coupled to that drive point position.

To illustrate the definition of weighted mean position, consider the positions of the RF drive points in FIG. 8 with respect to an x-y coordinate system whose x-axis is the previously defined imaginary center line 60 and whose y-axis extends in a positive direction from the center of the back wall 20 toward the workpiece passageway. Suppose the y-coordinate of the position of each RF drive point 51-56 is represented by the corresponding variable Y1-Y6. Suppose the RF power level supplied by the RF power splitter to each RF drive point is represented by the corresponding variable P1-P6. The y-coordinate of the weighted mean position of the RF drive points therefore is [(P1 Y1)+(P3 Y3)+(P5 Y5)]/(P1+P3+P5). The even numbered variables can be omitted from this equation because the drive points and power levels are symmetric with respect to the y-axis, i.e., because P1=P2, P3=P4, P5=P6, Y1=Y2, Y3=Y4, and Y5=Y6. Also, the symmetry with respect to the y-axis means the x-coordinate of the weighted mean position will be zero and hence can be ignored.

As a more concrete example, suppose the y-coordinates of the positions of RF drive points are as follows: points 51, 52 (Y1) are +1000 mm; points 53, 54 (Y3) are −800 mm; and points 55, 56 (Y5) are +50 mm. (Y3 is negative because positions on the second half 62 of the electrode are in the negative direction of the y-axis.) Suppose the time-averaged power levels supplied by RF power splitter outputs 71-73 are P1=5000 W, P2=4000 W and P3=3000 W, respectively. Therefore, the y-coordinate of the weighted mean position of the RF drive points is: [(1000*5000)−(800*4000)+(50*3000)]/(5000+4000+3000)=+162.5 mm. That is, the weighted mean position of the RF drive points is offset 162.5 mm from the imaginary center line 60 in the direction toward the workpiece passageway.

In the present invention, the weighted mean position of the RF drive points is between the center of the electrode and the workpiece passageway, i.e., it is in the first half 61 of the electrode. As described above in the section "3. RF Drive Point Offset from Center" with respect to a single RF drive point, this decreases the plasma density near the workpiece passageway. This offsets the increase in plasma density near the workpiece passageway that otherwise would exist if the RF power distribution were symmetrical as in conventional plasma chambers.

The weighted mean position of the RF drive points—specifically, the distance by which the weighted mean position is offset from the center of the electrode toward the workpiece passageway—preferably is established so as to minimize either the spatial non-uniformity of the plasma density or the spatial non-uniformity of the plasma fabrication process being performed on the workpiece. Such non-uniformity can be minimized by adjusting the relative power levels of the outputs 71-73 of the RF power splitter, by adjusting the positions of the RF drive points 51-56, or both. The capability of adjusting both power level and position should enable achievement of better spatial uniformity than could be achieved by adjusting only one or the other.

8. Time Averaging

The difference in RF power levels supplied to different RF drive points can be a time-averaged difference rather than a continuous difference.

For example, in any of the embodiments having an RF power splitter 70, instead of continuously producing different RF power levels at its outputs, the RF power splitter can time-multiplex its outputs so that it sequentially and periodically couples the full output level from the RF power supply 30 to its different outputs.

For example, consider the embodiment of FIG. 4 in which one output 71 of the RF power splitter 70 connects to RF drive points on the first half 61 of the electrode, and the other output 72 connects to the second half 62 of the electrode. The first time period T1 should be greater than the second time period T2 in order to supply a greater time-averaged power level to the first half 61 than to the second half 62 of the electrode. To minimize the spatial non-uniformity of the plasma density or minimize the spatial non-uniformity of the plasma fabrication process being performed on the workpiece, the ratio between the two time periods T1 and T2 preferably is established by routine experimentation in the same manner as the difference between two power levels as described above.

As a more complex example, consider the power splitter 70 of FIG. 8 that has three outputs 71, 72, 73. The power splitter can couple the full output power from the RF power supply 30 it the first power splitter output 71 for a first time period T1, then couple the same output level to the second power splitter output 72 for a second time period T2, and then couple the same output level to the third power splitter output 73 for a third time period T3. The effective RF power level supplied by each output of the power splitter is the full output level multiplied by the fraction of time that the respective output is active (i.e., turned on). For example, the effective RF power level supplied by the first output 71 is the full output power level multiplied by T1/(T1+T2+T3).

Alternatively, the RF power splitter 70 in any of the embodiments of FIGS. 2-8 can output different, non-zero power levels during the respective time periods T1, T2, T3, etc. rather than alternating between full power to one output and zero power to the other output. For example, in any of the embodiments having attenuators (FIGS. 5-7), the attenuators 41-44 can be time-varying impedances, such as time-varying capacitors, as described above in the last three paragraphs of the section entitled "5. Passive Attenuators as Power Splitter". In that case, the RF output level provided by each attenuator would be time-varying over a range of non-zero levels of RF power. As described in the above-referenced paragraphs, it is preferable to change two or more of the impedances in opposite directions so that the total impedance of the multiple attenuators remains approximately constant, i.e., so that the total impedance at the input 77 of the power splitter 70 remains approximately constant. This has the advantage of minimizing the need for the impedance matching network 40 to match different impedances as the attenuators are adjusted.

As a further alternative, the illustrated single RF power supply connected to an RF power splitter can be replaced by a plurality of RF power supplies, with each RF power supply being connected to a different group of one or more RF drive points.

9. Multiple RF Power Supplies

In any of the embodiments having multiple RF drive points, the illustrated RF power splitter or attenuator in combination with a single RF power supply can be replaced by a plurality of RF power supplies, such that each RF power supply is connected to a different group of one or more RF drive points. A controller connected to the RF power supplies can control the RF power supplies to output different power levels either continuously or in a periodically. In any event, for the purpose of determining the weighted mean position of the RF drive points as defined above, the effective RF power supplied to each respective RF drive point would be the time-averaged RF power supplied to that respective RF drive point.

The invention claimed is:

1. A method of coupling RF power to a plasma chamber, comprising the steps of:
providing a plasma chamber having a workpiece passageway;
providing an electrode positioned so as to couple electrical power from the electrode to a plasma within the plasma chamber, wherein a first half of the electrode is closer to the workpiece passageway than a second half of the electrode;
providing one or more RF drive points on the first half of the electrode and one or more RF drive points on the second half of the electrode;
connecting at least a first capacitor between a supply of RF power and one or more of the RF drive points on the first half of the electrode;
connecting at least a second capacitor between said supply of RF power and one or more of the RF drive points on the second half of the electrode;
supplying a first time-averaged level of RF power to the first half of the electrode; and
supplying a second time-averaged level of RF power to the second half of the electrode;
wherein the second time-averaged level of RF power is greater than or equal to zero;
wherein the first time-averaged level of RF power is greater than the second time-averaged level of RF power; and
wherein the sum of the capacitances of the capacitors connected to RF drive points on the first half of the electrode is less than the sum of the capacitances of the capacitors connected to RF drive points on the second half of the electrode.

2. The method of claim 1, further comprising the step of:
increasing the capacitance of at least one of the capacitors while concurrently decreasing the capacitance of at least another one of the capacitors so that the total capacitance of the capacitors connected to RF drive points on the electrode remains constant.

3. The method of claim 1, wherein:
said at least a first capacitor includes a first plurality of capacitors; and
said method further comprises the steps of:
connecting together each of the first plurality of capacitors at an input at which each of the capacitors receives RF power from said supply of RF power; and
increasing the capacitance of at least one of the capacitors while concurrently decreasing the capacitance of at least another one of the capacitors so that the total capacitance between the input and the electrode remains constant.

4. The method of claim 1, further comprising the steps of:
providing a power splitter having an input and a plurality of outputs;
supplying RF power to the input of the power splitter; and connecting each output of the power splitter to supply RF power to one or more of the RF drive points;
wherein the power splitter supplies a greater level of RF power to the RF drive points on the first half of the electrode than to the RF drive points on the second half of the electrode.

5. The method of claim 4, wherein:
the power splitter comprises one or more attenuators such that each attenuator is connected between the input of the power splitter and one of the outputs of the power splitter.

6. The method of claim 5, wherein:
a plurality of the attenuators have a time-varying reactance such that the reactance of at least a first one of the attenuators increases when the reactance of at least a second one of the attenuators decreases so that the total reactance of the attenuators connected between the input of the power splitter and the electrode remains constant.

7. The method of claim 1, further comprising the step of:
connecting one or more attenuators between one of the one or more RF power supplies and one or more RF drive points on the electrode.

8. The method of claim 1, wherein the electrode comprises:
a back wall having one or more RF drive points;
a showerhead; and
a suspension connected between the showerhead and the back wall;
wherein the one or more RF power supplies are connected to supply RF power to the RF drive points on the back wall.

9. The method of claim 1, further comprising the step of:
supplying RF power to an RF drive point located at the center of the electrode.

10. The method of claim 1, further comprising the step of:
supplying RF power to one or more RF drive points that are positioned on the geometric boundary between the first and second halves of the electrode.

11. The method of claim 1, wherein:
the step of supplying the first time-averaged level of RF power comprises supplying RF power to a first number of the RF drive points on the first half of the electrode; and
the step of supplying the second time-averaged level of RF power comprises supplying RF power to a second number of the RF drive points on the second half of the electrode;
wherein the first number is greater than the second number.

12. The method of claim 1, further comprising the steps of:
supplying RF power to a plurality of RF drive points on the electrode;
wherein the weighted mean position of the RF drive points, based on weighting each drive point position by the time-averaged level of RF power coupled to that drive point position, is between the center of the electrode and the workpiece passageway.

13. The method of claim 12, wherein the electrode comprises:
a back wall;
a showerhead; and
a suspension connected between the showerhead and the back wall;
wherein the RF drive points are on the back wall.

* * * * *